United States Patent [19]

Stockmeier et al.

[11] Patent Number: 5,541,453

[45] Date of Patent: Jul. 30, 1996

[54] POWER SEMICONDUCTOR MODULE

[75] Inventors: Thomas Stockmeier; Uwe Thiemann, both of Rancho Palos Verdes; Reinheld Bayerer, Chula Vista, all of Calif.

[73] Assignee: ABB Semiconductors, Ltd., Lenzuburg, Switzerland

[21] Appl. No.: 422,169

[22] Filed: Apr. 14, 1995

[51] Int. Cl.$^6$ ..................................................... H01L 23/34
[52] U.S. Cl. ........................ 257/723; 257/724; 257/691
[58] Field of Search ..................................... 257/666, 691, 257/700, 723, 724, 692, 341

[56] References Cited

U.S. PATENT DOCUMENTS

| 5,089,878 | 2/1992 | Lee | 257/666 |
| 5,291,065 | 3/1994 | Arai | 257/691 |

FOREIGN PATENT DOCUMENTS

| 0597144 | 5/1994 | European Pat. Off. . |
| 3931634 | 4/1991 | Germany . |
| 4330070 | 3/1994 | Germany . |

Primary Examiner—Sara W. Crane
Assistant Examiner—S. V. Clark
Attorney, Agent, or Firm—Oblon, Spivak, McClelland, Maier & Neustadt, P.C.

[57] ABSTRACT

A power semiconductor module includes a housing having a baseplate, on which at least one power semiconductor switching element is arranged, the power semiconductor switching element having at least two power electrodes connected to corresponding power connections, the power connections extending parallel to the base plate and passing out of the housing parallel to the base plate, thereby extending above one another in a plurality of planes and being connected to the corresponding power electrodes of the power semiconductor switching element by connecting wires, the power semiconductor module including a plurality of control and auxiliary connections wherein the control and auxiliary connections are passed out of the housing at right angles to the base plate and the control and auxiliary connections are designed for plugging into the control unit driving the module, and the power semiconductor module including fastening mechanisms provided on the housing and fixing the control unit on the housing of the module.

4 Claims, 3 Drawing Sheets

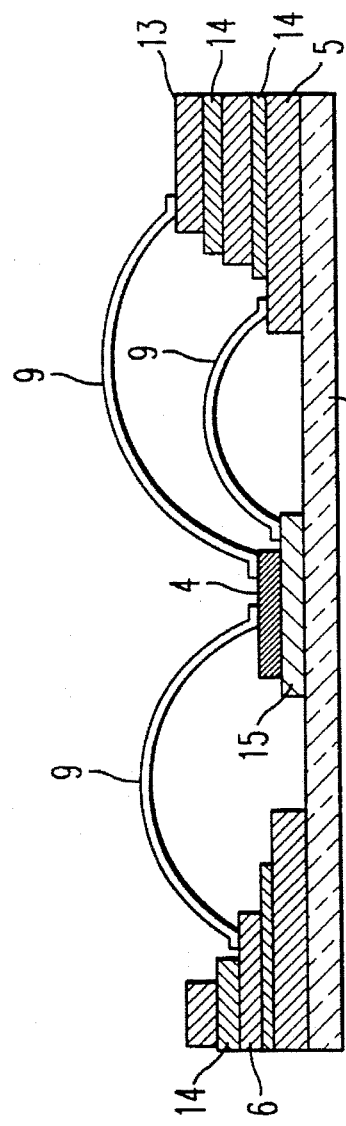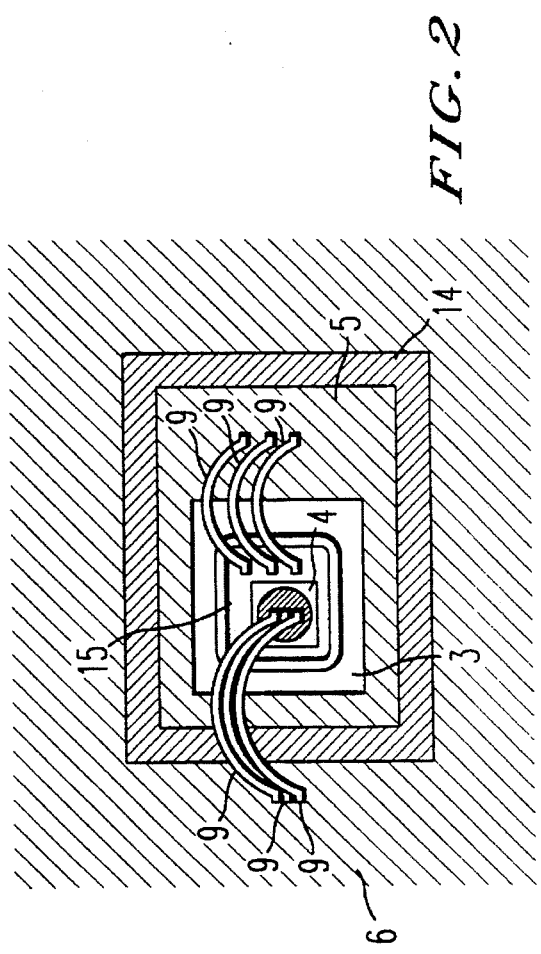

POWER SEMICONDUCTOR MODULE

BACKGROUND OF THE INVENTION

1. Field of the Invention

The invention relates to the field of power electronics.

2. Description of the Prior Art

Such power semiconductor modules are already described, for example, in German Offenlegungsschriften DE-A1-39 31 634 and DE-A1-43 30 070.

In the case of these power semiconductor modules, which comprise a baseplate having at least one power semiconductor switching element, the power connections extend perpendicularly with respect to the baseplate (see DE 39 31 634 FIG. 4 and column 5, lines 24 ff. and DE 43 30 070 FIG. 8). The power connections are passed out of the module housing perpendicularly with respect to the baseplate. This means that the control units have to be positioned at a certain distance, for example above or alongside, from the modules. This results in relatively long connecting lines to the control unit which serves to drive the module. The long connecting lines result in an undesirably high inductance of the arrangement, it being possible for this inductance to have a limiting effect, in particular with regard to high switching frequencies.

SUMMARY OF THE INVENTION

It is therefore the object of the present invention to specify a power semiconductor module in which the connecting lines to the control unit are as short as possible and the arrangement thereby has an inductance which is as low as possible.

This object is achieved in the case of a power semiconductor module of the type mentioned in the introduction by the features of the first claim.

The essence of the invention is therefore that the power connections extend parallel to the baseplate and are passed out of the housing parallel to the baseplate. This makes it possible to mount the control unit directly on that surface of the module housing which faces away from the baseplate. This allows the use of short connecting lines and hence a low-inductance structure.

In addition, if that control connection which has the smallest potential difference, ideally no potential difference at all, with respect to the control unit is arranged the furthest away from the baseplate, then this power connection still acts for the control unit as a shield for electromagnetic fields caused by the switching of the module.

In order to fasten the control unit on the module, fastening means such as, for example, screw-holes and screws are provided on that side of the module housing which faces away from the baseplate. The control and auxiliary connections can be passed out at the top of the housing. The control unit is then plugged onto these connections and the control and auxiliary connections of the module and the corresponding connections of the control unit are connected, for example, by means of simple screw or plug contacts. This means that a direct connection between the control and auxiliary connections and the control unit is achieved, and the otherwise relatively long and hence inductance-loaded supply lines are dispensed with. Further exemplary embodiments emerge from the corresponding dependent claims.

Consequently, modules according to the invention can be used to produce circuit arrangements in which the control unit of the modules is fitted directly on the modules and in which it is possible to establish the connection between the module and the control unit advantageously with a low inductance, with the result being that the modules can be used particularly for higher frequencies.

BRIEF DESCRIPTION OF THE DRAWINGS

The invention is explained in more detail below using exemplary embodiments in conjunction with the drawings, in which:

FIG. 1 shows a section through a cut-open module according to the invention, without a housing;

FIG. 2 shows a view of an opened module according to the invention;

The reference symbols used in the drawings and their meaning are summarized in the list of designations. In principle, like parts are provided with like reference symbols in the figures.

DESCRIPTION OF THE PREFERRED EMBODIMENT

Figure 3:
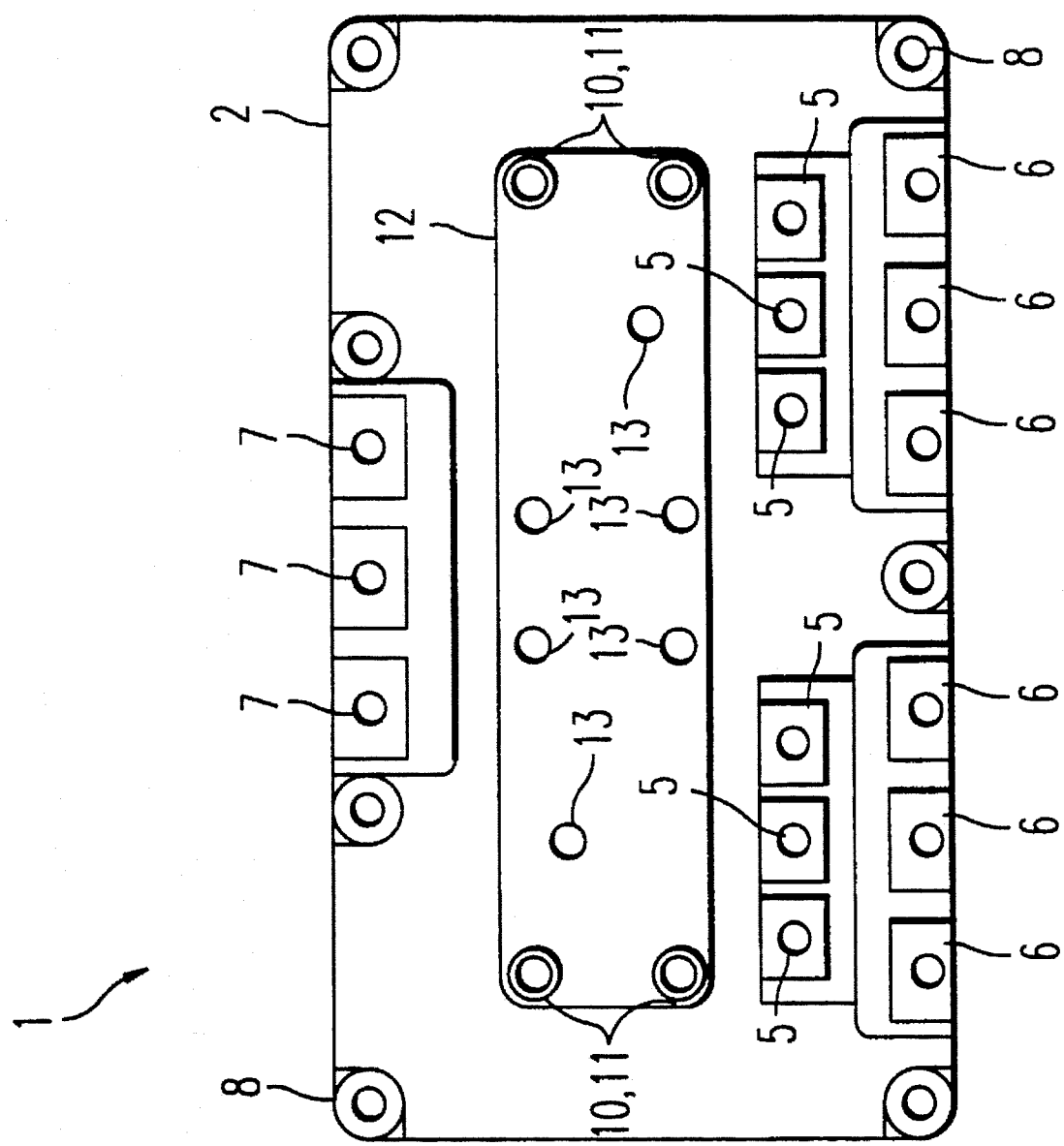
FIG. 3 shows a module according to the invention with a control unit put on, from above.

FIG. 3 shows the structure of a circuit arrangement having a power semiconductor module 1 and a control unit 12. The control unit 12 is fastened on the housing 2 of the module 1, for example by means of screws 10 which are passed through corresponding screw-holes 11. The module housing 2 can likewise have screw-holes 8, which are used for fastening in an installation. The power semiconductor module 1 has a number of control and auxiliary connections 13, which are connected to the control unit 12, in particular by means of a plug connection. The control and auxiliary connections are used, on the one hand, to turn the module 1 on and off and, on the other hand, to monitor it. In addition, the module 1 has at least two power connections 5 and 6, which are passed out of the housing 2 to the side. A load connection 7 is additionally provided in the case of a half-bridge module. Since the control unit 12 is put directly onto the housing 2 of the module, the connecting lines between the control and auxiliary connections 13 and the control unit can be chosen to be very short and hence be of low inductance.

This is achieved due to the fact that, as is shown in principle in FIG. 1, the power connections 5 and 6 extend parallel to a baseplate 3 onto which a power semiconductor switching element 4 is fitted. The power semiconductor switching element is, in particular, an IGBT chip, that is to say a bipolar transistor chip having a gate which is arranged in an insulated manner. As FIG. 2 shows from above and FIG. 1 shows in section, the connection between the power electrodes and the corresponding power connections 5 and 6 can be established, for example, by means of bonding wires 9.

Therefore, a power semiconductor module according to the invention is structured in principle as follows: ceramic substrates 15 are soldered on a baseplate 3, for example a copper plate 8 mm thick, which can also still be used, if need be, as a cooler. The substrates are each assigned to a switching element 4. This comprises, for example, at least one IGBT chip with an associated freewheeling diode. The substrates 15 are metallized over the whole area. The power connections 5, 6 and, if applicable, the load connection is supplied from the side by means of connecting lines 9, in particular by means of bonding wires ("wire bonds") or soldered strips ("solder clips"). The connecting lines 9 lead to the corresponding power connections 5 and 6, if applicable to the load connection 7 and to the control and auxiliary connections 13 which are arranged in different planes and extend parallel to the baseplate.

The power connections 5, 6 and, if applicable, power connection 7 is are passed, parallel to the baseplate 3, out of the housing 2 to the side. In contrast with the power connections 5, 6 and, if applicable, load connection is, the auxiliary and control connections 13 can be passed out at right angles to the baseplate 3. Using these connections, the control unit 12 can be connected by simply plugging onto the corresponding connections.

If that power connection, for example power connection 6, which deviates the least, with reference to the electrical potential, from that of the control unit 12 is now arranged the furthest away from the baseplate 3 and the nearest to the control unit 12, then this power connection additionally serves as an electromagnetic shield as well. Said shield protects the control unit 12 from the influence of the electromagnetic fields caused by the switching of the module. These fields are caused by the high currents and voltages which are to be switched in the shortest possible time using the module. Without special shielding, the fields may lead to serious malfunctions of a power-electronic circuit arrangement and, in addition to other influencing factors, may also hinder the further development to higher switching frequencies.

Figure 4:
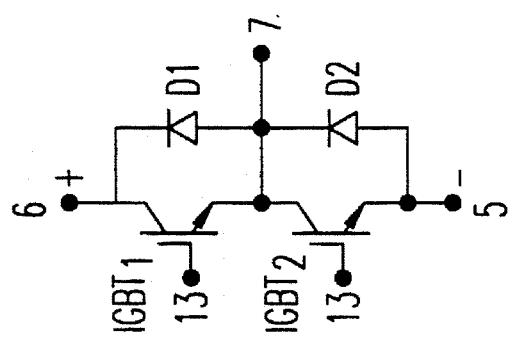
FIG. 4 shows an equivalent circuit diagram of a half-bridge with IGBTs.

It is also possible using the structure according to the invention to construct complete half-bridge modules or even more extensive power-electronic circuits, for example a three-phase module. FIG. 4 shows the equivalent circuit diagram of a half-bridge. Here, two switching elements 4 are connected in series between a positive and a negative connection. Each of the switching elements is at least one switch chip, here in the form of an IGBT (IGBT1, IGBT2), having an associated freewheeling diode D1, D2. The common junction corresponds in this case to the load connection 7, the positive and negative connection corresponds to the power connections 5, and 6. The two IGBTs are driven by in each case one gate or control connection 13.

Figure 5:
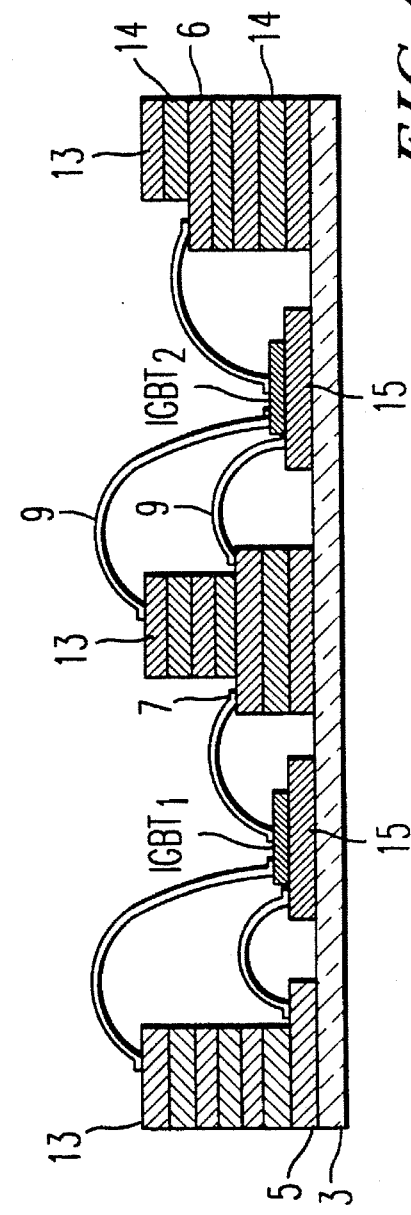
FIG. 5 shows a sectional view of a half-bridge module.

FIG. 5 shows such a module in section. The substrates 15 of the switching elements 4, that is to say the IGBTs (IGBT1, IGBT2, 4), are fitted on the baseplate 3. The power connections 5 and 6 as well as the common load connection 7 are arranged in different planes and are connected to the corresponding electrodes of the semiconductor switches via the connecting wires 9. In the example illustrated, the two control connections 13 of the IGBTs are arranged on the same connection plane. In this case, the corresponding connection plane is structured, for example by means of conductor tracks, with the result being that the connections are electrically isolated. Insulating layers 14 must be inserted between two adjacent planes or connections. Of course, it is also conceivable to arrange substrates and switching elements on both sides of the baseplate 3.

If such a half-bridge module is integrated into a structure as illustrated in FIG. 3, then the load connection 7 is passed out in the figure to one side and the power connections 5 and 6 are passed out in different planes to the opposite side. It can also clearly be seen how the control unit 12 is plugged onto the control and auxiliary connections 13. The connection to the control unit 12 can be carried out, for example, by means of simple plug or screw connections.

It is possible, therefore, by means of the structure according to the invention of a power semiconductor module, to build a low-inductance and hence rapid but nevertheless readily electromagnetically compatible circuit arrangement. This is of paramount importance with regard to higher switching frequencies.

What is claimed is:

1. A power semiconductor module, comprising:

a housing having a baseplate on which at least one power semiconductor switching element is arranged, the power semiconductor switching element having at least two power electrodes connected to corresponding power connections, said power connections extending parallel to the baseplate and passing out of the housing parallel to the baseplate, thereby extending above one another in a plurality of planes and being connected to the corresponding power electrodes of the power semiconductor switching element by connecting wires, the power semiconductor modules including a plurality of control and auxiliary connections wherein the control and auxiliary connections are passed out of the housing at right angles to the baseplate and the control and auxiliary connections are pluggable into a control unit driving the module, the power semiconductor module including fastening mechanisms provided on the housing and fixing the control unit on the housing of the module.

2. A module according to claim 1, wherein a connection of the control connections which has the smallest potential difference with respect to the control unit is arranged furthest away from the baseplate and nearest to the control unit.

3. A circuit arrangement having at least one power semiconductor switch module which is connected to a control unit which drives the module, wherein the power semiconductor module comprises:

a housing having a baseplate on which at least one power semiconductor switching element is arranged, the power semiconductor switching element having at least two power electrodes connected to corresponding power connections, said power connections extending parallel to the baseplate and passing out of the housing parallel to the baseplate, thereby extending above one another in a plurality of planes and being connected to the corresponding power electrodes of the power semiconductor switching element by connecting wires, the power semiconductor modules including a plurality of control and auxiliary connections wherein the control and auxiliary connections are passed out of the housing at right angles to the baseplate and the control and auxiliary connections are pluggable into a control unit driving the module, the power semiconductor module including fastening mechanisms provided on the housing and fixing the control unit on the housing of the module; and wherein the control unit is arranged parallel to the base plate on the housing of the module.

4. A circuit arrangement as claimed in claim 3, wherein a control connection of the control connection which has the smallest potential difference with respect to the control unit is arranged furthest away from the base plate and nearest to the control unit.

\* \* \* \* \*

UNITED STATES PATENT AND TRADEMARK OFFICE
CERTIFICATE OF CORRECTION

PATENT NO. : 5,541,453
DATED : July 30, 1996
INVENTOR(S) : Thomas STOCKMEIER, et al.

It is certified that error appears in the above-indentified patent and that said Letters Patent is hereby corrected as shown below:

On the title page, Item [75, the 3rd inventor name should read:

-- [75] Reinhold BAYERER --

Signed and Sealed this

Twenty-ninth Day of October 1996

Attest:

BRUCE LEHMAN

*Attesting Officer*  *Commissioner of Patents and Trademarks*